US006370074B1

(12) United States Patent
Jeffery et al.

(10) Patent No.: US 6,370,074 B1

(45) Date of Patent: Apr. 9, 2002

(54) REDUNDANT ENCODING FOR BURIED METAL FUSES

(75) Inventors: Roger M. Jeffery, Kempton; Peter T. Liu, Allentown, both of PA (US)

(73) Assignee: Agere Systems Guardian Corp, Allentown, PA (US)

(*) Notice: Subject to any disclaimer, the term of this patent is extended or adjusted under 35 U.S.C. 154(b) by 0 days.

(21) Appl. No.: 09/566,099

(22) Filed: May 5, 2000

(51) Int. Cl.[7] .................................................. G11C 7/00

(52) U.S. Cl. ..................................... 365/225.7; 365/200

(58) Field of Search .............................. 365/225.7, 200, 365/96, 189.05; 327/525

(56) References Cited

U.S. PATENT DOCUMENTS 5,566,107 A * 10/1996 Gilliam ...................... 365/200
5,621,691 A * 4/1997 Park ........................... 365/200
5,831,923 A * 11/1998 Casper .................... 365/225.7
5,929,691 A * 7/1999 Kim et al. .................. 327/525
5,966,339 A * 10/1999 Hsu et al. ................ 365/225.7
5,991,220 A * 11/1999 Freyman et al. ......... 365/225.7
5,999,038 A * 12/1999 Pathak et al. ............... 327/525
6,006,169 A 12/1999 Sandhu et al. .............. 702/132

* cited by examiner

*Primary Examiner*—Richard Elms
*Assistant Examiner*—Anh Phung
(74) *Attorney, Agent, or Firm*—Duane Morris & Heckscher LLP; Steven E. Koffs

(57) ABSTRACT

An integrated circuit has a plurality of buried metal fuses and an apparatus for selectively controlling the plurality of buried metal fuses. Each buried metal fuse has an output state. A plurality of latches each correspond to a respective one of the plurality of buried metal fuses. An encoding fuse has a first state and a second state. A plurality of gates, consists of either a plurality of XOR gates or a plurality of XNOR gates. Each gate has a first input coupled to the output of a respective one of the plurality of buried metal fuses and a second input coupled to the encoding fuse. Each gate has an output coupled to a respective one of the plurality of latches. Each of the plurality of latches has an output state that is the same as the state of the respective one of the plurality of buried metal fuses to which that latch is coupled, when the encoding fuse is in the first state. Each of the plurality of latches has an output state that is opposite the state of the respective one of the plurality of buried metal fuses to which that latch is coupled, when the encoding fuse is in the second state.

11 Claims, 3 Drawing Sheets

400

REDUNDANT ENCODING FOR BURIED METAL FUSES

FIELD OF THE INVENTION

The present invention relates to fabrication of semiconductor integrated circuits.

DESCRIPTION OF THE RELATED ART

In an application in which trimming of precise circuit characteristics is necessary, fuse links are commonly placed on integrated circuit (IC) chips. A pre-determined algorithm based upon the circuit's behavior under nominal processing conditions is used to determine the appropriate fuse links to be "blown" or opened to adjust the circuit parameters accordingly.

For example, U.S. Pat. No. 5,991,220 to Freyman et al., which is expressly incorporated by reference herein in its entirety, describes an apparatus for selectively controlling a plurality of fuses associated with an IC. Each fuse is switchable from a closed state to an open state. The apparatus has a data register including an array of internal registers. Each of the internal registers is coupled with one of the fuses. Each internal register is identified by an address and is separately addressable. An instruction register contains instructions for determining whether the fuses are to assume the opened state or the closed state. A controller connects the data register and the instruction register. The controller combines with the data register to cause the fuses associated with the internal registers to assume the states determined by the instruction register.

Programming buried metal fuses is not without difficulties. For example, the state of each fuse (i.e., "opened" or "closed") is generally serially established (one at a time), which is time consuming. The total amount of time required to blow all of the required fuses may be significant. Large arrays of metal fuses, such as those used to store encryption keys or serial numbers, can take a long time to program.

A method of reducing the time required to configure the fuses is desired.

Another problem inherent with buried metal fuses is their reliability. A programmed fuse is less reliable than an intact fuse, because environmental factors, such as moisture can degrade a programmed fuse severely enough to cause the fuse to be detected as intact, even after the fuse is blown. Also, in some instances, if the line width of a given fuse is too great (i.e., its resistance is too low), then an amount of power normally sufficient to blow a nominally dimensioned fuse may not be sufficient to blow that given fuse. If it is necessary for that given fuse to be opened to trim the circuitry, but the fuse is detected as being closed, the IC is normally not usable.

A method of salvaging IC's which have defective buried metal fuses is desired.

SUMMARY OF THE INVENTION

One aspect of the present invention is a method for handling outputs from a plurality of fuses coupled to a semiconductor device. Each fuse has an output state. The plurality of fuses are divided into first and second subsets of the plurality of fuses, such at that the fuses in the first subset are to be blown and the fuses in the second subset are to remain intact. A determination is made as to whether a number of fuses in the first subset is greater than half of a total number of fuses in the plurality of fuses. The output state of each of the plurality of fuses is inverted, and each fuse in the second subset is blown, if the number of fuses in the first subset is greater than half of the total number of fuses.

Another aspect of the invention is a method for handling outputs from a plurality of fuses coupled to a semiconductor device. Each fuse has an output state. The plurality of fuses are divided into first and second subsets of the plurality of fuses, such that the fuses in the first subset are to be blown and the fuses in the second subset are to remain intact. A determination is made as to whether any of the fuses in the first subset have a defect that causes that fuse to be detected as intact when blown. The output state of each of the plurality of fuses is inverted and each fuse in the second subset is blown, if any of the first subset of fuses has the defect.

Another aspect of the invention is a semiconductor device including a plurality of fuses and an apparatus for selectively handling the outputs of the plurality of fuses. Each fuse has an output state. The apparatus includes a plurality of latches, each latch coupled to an output of a respective one of the plurality of fuses. An encoding fuse is coupled to each of the plurality of latches. The encoding fuse has a first state in which each of the plurality of latches has an output that is the same as the state of the respective one of the plurality of fuses to which that latch is coupled. The encoding fuse has a second state in which each of the plurality of latches has an output that is opposite the state of the respective one of the plurality of fuses to which that latch is coupled.

DETAILED DESCRIPTION

Figure 1:
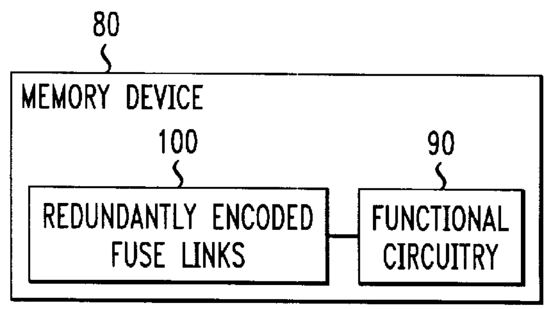
FIG. 1 is a block diagram of an integrated circuit according to the present invention, including functional circuitry, and redundantly encoded buried metal fuses.

FIG. 1 is a block diagram of an exemplary integrated circuit 80, containing functional circuitry 90 and redundantly encoded buried metal fuse links 100. The fuse links 100 are used to trim the functional circuitry 90, preferably during wafer probe testing. Although the diagram shows a single functional circuitry block 90 and a single fuse link block 100, an integrated circuit according to the invention may have any number of functional circuits to be trimmed, each having a respective set of redundantly buried metal fuse links. Any or all of the sets of buried metal fuse links may be redundantly encoded, as described below.

Although FIG. 1 shows a memory device, the integrated circuit 80 may be any type of integrated circuit, including a processor, a filter, or the like.

Figure 2A:
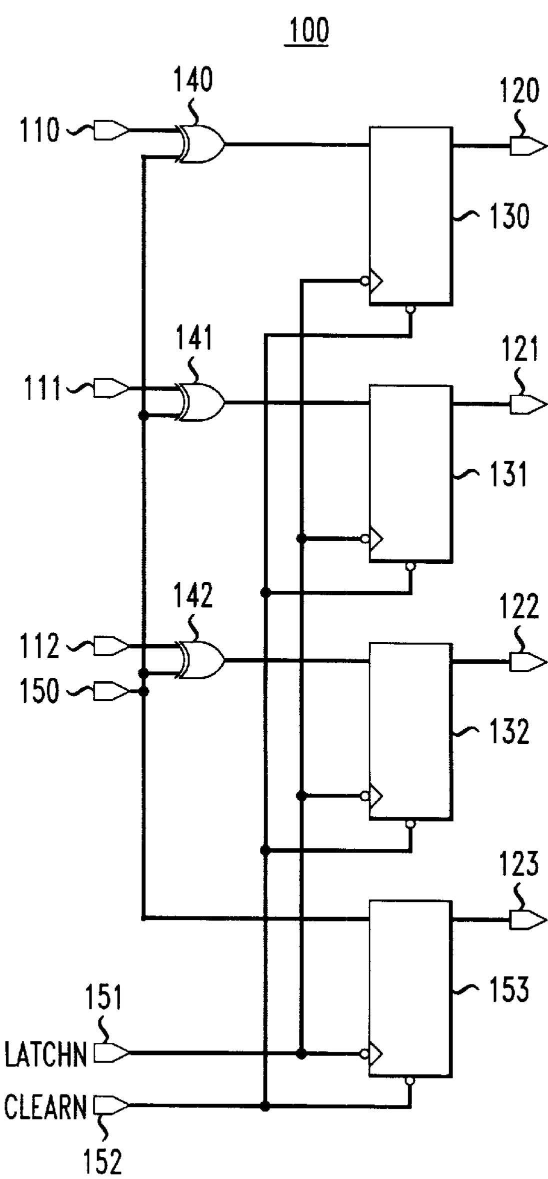
FIG. 2A is a schematic diagram of an exemplary circuit for redundant encoding of buried metal fuses according to the present invention.

FIG. 2A shows the redundantly encoded fuse subsystem 100 of FIG. 1. Subsystem 100 includes a plurality of fuses 110–112, each having an output state. The fuses 110–112 may be buried metal fuses.

Figure 4:
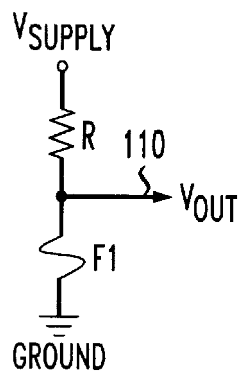
FIG. 4 is a schematic diagram of one of the exemplary fuse links shown in FIG. 1.

FIG. 4 shows an example of a fuse circuit 400 usable to provide the state of fuse 110 to the subsystem of FIG. 2A.

The fuse F1 is connected between the resistor R and ground, so that the state sensed at the fuse output 110 is logic low ("zero") when the fuse is intact (closed) and logic high ("one") when the fuse is blown (open). The remaining fuses 111, 112 and 150 in FIG. 2A may be configured similarly. The fuse circuit 400 of FIG. 4 is only an example of a circuit for providing the state of the fuses to the redundant encoding circuitry 100. Other fuse circuits known by those skilled in the art may be used.

Referring again to FIG. 2A, an apparatus is provided for selectively handling the signals output from the plurality of fuses 110–112. The apparatus includes a plurality of latches 130–132. Each latch 130–132 is coupled to an output of a respective one of the plurality of fuses 110–112. In the exemplary embodiment, each of the plurality of latches 130–132 is a D flip-flop, with a respective output 120–122. Other conventional latch devices capable of storing and outputting a logic state may be used.

An encoding fuse 150 is coupled to each of the plurality of latches 130–132. The encoding fuse 150 has a first state and a second state. An additional latch 153 (which may also be a D flip-flop) stores the state of the encoding fuse 150. When the encoding fuse 150 is in the first state, each of the plurality of latches 130–132 has an output that is the same as the state of the respective one of the plurality of fuses 110–112 to which that latch is coupled. When the encoding fuse 150 is in the second state, each of the plurality of latches 130–132 has an output that is opposite the state of the respective one of the plurality of fuses 110–112 to which that latch is coupled.

The exemplary circuitry 100 includes means responsive to the encoding fuse 150 for inverting an output of each of the plurality of fuses 110–112, when the encoding fuse is in the second state. The exemplary inverting means include a plurality of XOR gates 140–142. Each XOR gate 140–142 has a first input coupled to the output of a respective one of the plurality of fuses 110–112 and a second input coupled to the encoding fuse 150. Each XOR gate 140–142 has an output coupled to a respective one of the plurality of latches 130–132.

In the exemplary embodiment, the signals are active high. When the encoding fuse 150 is intact (a "zero"), each of the three XOR gates 140–142 outputs a "zero" if its respective fuse 110–112 is intact (a "zero"), or a "one" if its respective fuse 110–112 is open (a "one"). That is, the output states of flip-flops 120–122 match the fuse states at 110–112. When the encoding fuse 150 is blown (a "one"), each of the three XOR gates 140–142 outputs a "one" if its respective fuse 110–112 is intact (a "zero"), or a "zero" if its respective fuse 110–112 is open (a "one"). Thus, when the encoding fuse 150 is blown, the output states of flip-flops 120–122 are the complement of the fuse states at 110–112.

Also shown in FIG. 2A, a common "latchn" signal 151 is provided to all of the flip-flops 120–122, 153 to cause the flip-flops to latch the output signals of XOR gates 140–142 and encoding fuse 150, respectively. A common "clearn" signal 151 is provided to all of the flip-flops 120–122, 153 to clear the flip-flops.

Figure 2B:
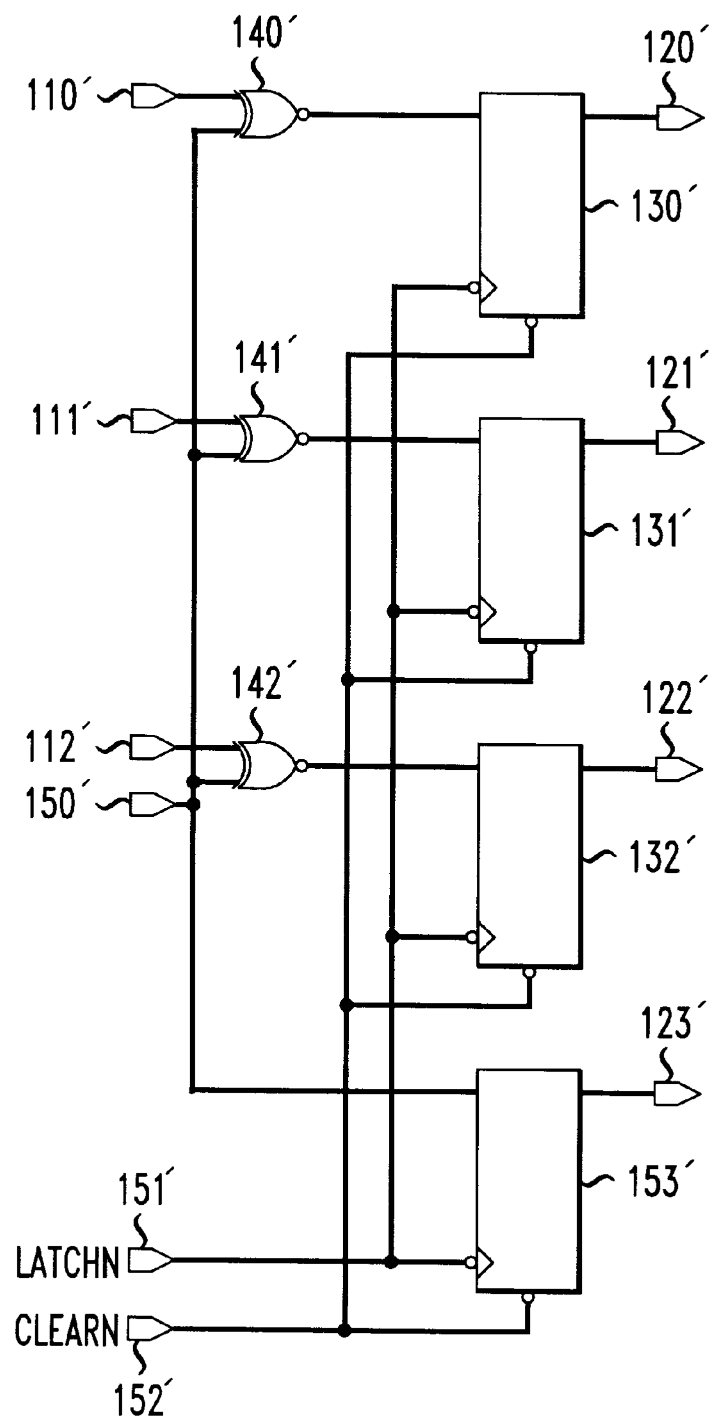
FIG. 2B is a schematic diagram of a variation of the exemplary circuit of FIG. 2A, using XNOR gates.

FIG. 2B is a variation of the exemplary encoding circuitry of FIG. 2A. In FIG. 2B, the circuitry 100' includes a plurality of XNOR gates 140'–142', instead of XOR gates 140–142 as used in FIG. 2A. Each XNOR gate 140'–142' has a first input coupled to the output of a respective one of the plurality of fuses 110'–112' and a second input coupled to the encoding fuse 150'. Each XNOR gate 140'–142' has an output coupled to a respective one of the plurality of latches (D flip-flops 130'–132'). In other respects, the elements of FIG. 2B, designated with the prime (') symbol, are the same as the corresponding unprimed elements of FIG. 2A.

In operation, circuitry 100' is analogous to the circuity 100 described above with reference to FIG. 2A, with one main difference. Circuitry 100' is intended for use in a system where the functional circuitry 90 expects to receive active low signals. With the encoding fuse 150' intact, outputs 120'–122' are logic high signal ("one") when the corresponding fuse 110'–112' is intact (closed) and a logic low ("zero") signal when the corresponding fuse is blown (open). With encoding fuse 150' blown, latch output signals 120'–122' are "zero" when the corresponding fuse 110'–112' is intact and "one" when the corresponding fuse is blown.

Although the exemplary embodiment shows a single encoding fuse 150 for the entire fuse array, one can supplement any subgroup of fuses in an array with a redundant (encoding) fuse 150 for improved granularity. For example, an encoding fuse 150 may be provided for every subgroup of three fuses in a larger array of fuses. Any subgroup size may be used.

The exemplary subsystem may be used for at least two different purposes. One application for inverting the outputs from the fuses is to reduce the total time for blowing the buried metal fuses 110–112. Because it can take a long time to blow a large number of fuses, the circuitry of FIG. 2A or 2B may be used to limit the maximum number of fuses to be blown to one half the total number of fuses. If the normal trim algorithm determines that more than one half of the fuses should be blown, the outputs of the entire fuse array can be inverted by the apparatus of FIG. 2A or 2B, and the complementary pattern is programmed. In the extreme case, where the trim algorithm determines that most or all of the fuses 110–112 would be blown, the apparatus of FIG. 2A allows none or only a few of the fuses 110–112 to be blown.

An alternative use for the circuitry 100 or 110' of FIGS. 2A and 2B is to salvage a device having one or more defective fuses. For example, if fuse 110 has a defect that would make it appear intact when blown, and the trim algorithm specifies that fuse 110 should be blown, the apparatus of FIG. 2A or 2B can be used to invert the outputs from the array, Then the complement is programmed, so that the desired state of fuse 110 is "closed" (intact). Similarly, if the resistance of fuse 110 is insufficient, and application of the nominal blow current leaves fuse 110 intact (when the fuse should have blown to the open state), then programming the complement makes the desired state of fuse 110 "closed" (intact).

The circuitry 100 or 110' may alternatively be used to salvage an IC in which one of the fuses that should remain intact is, or appears to be, open (blown). If a fuse 111 appears blown, but should be intact (i.e., no blow current has been applied), inverting the fuse array outputs allows the complementary pattern to be programmed, in which case the desired state of fuse 111 is open (blown), and the array is rendered usable. Thus, the circuitry can salvage an IC if either one of the defects is present; i.e., a fuse that should be open appears closed, or a fuse that should be closed appears open.

Figure 3:
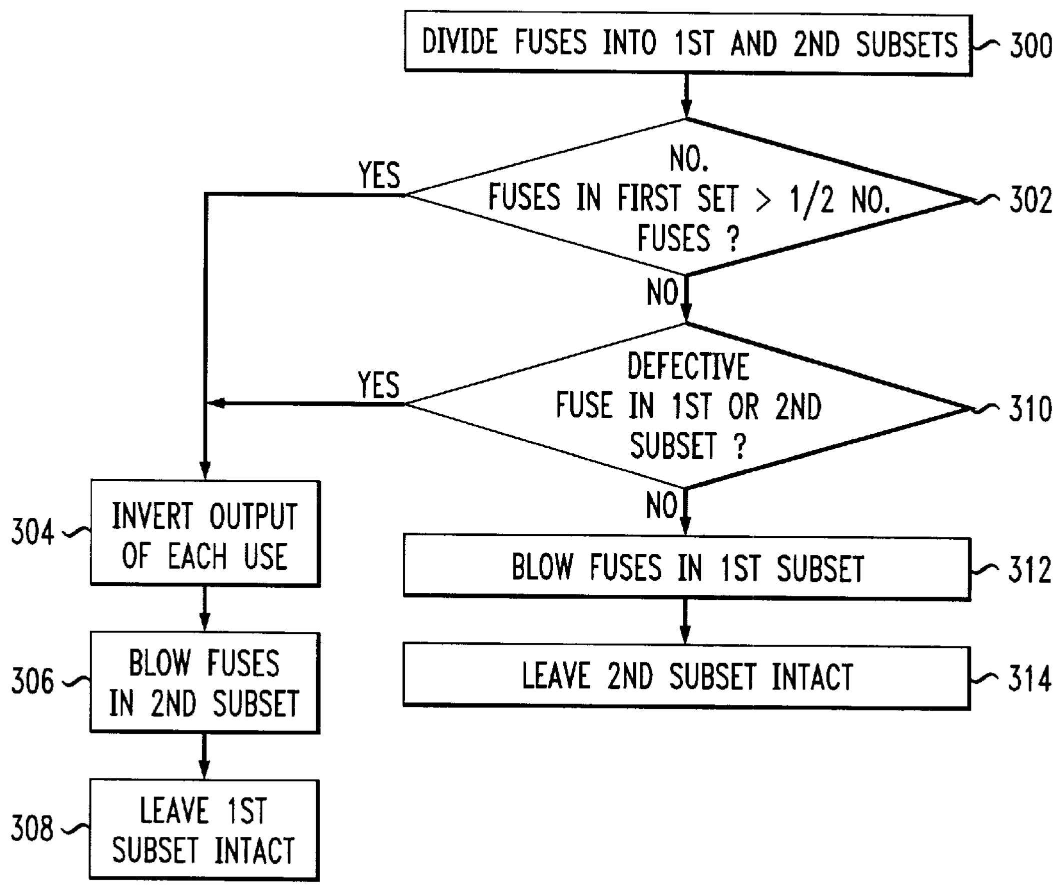
FIG. 3 is a flow chart diagram of an exemplary method for handling the outputs of the plurality of fuses in FIGS. 1 and 2A.

FIG. 3 shows an exemplary method for handling the outputs of a plurality of fuses 110–112 coupled to a semiconductor device 90. The method of FIG. 3 may be practiced using the apparatus of FIGS. 1 and 2A.

At step 300, the plurality of fuses 110–112 are divided into first and second subsets of the plurality of fuses, such that the fuses in the first subset are to be blown and the fuses in the second subset are to remain intact. The determination of which fuses are to be blown may be based on a conventional trim algorithm.

At step 302, a determination is made as to whether a number of fuses in the first subset is greater than half of a total number of fuses in the plurality of fuses 110–112. If so, then step 304 is executed.

At step 310, a determination is made whether the first subset of the fuses contains a defective fuse that would appear intact even if blown, or if the second subset of the fuses contains a defective fuse that would appear blown even if intact. If so, then step 304 is executed.

At step 304, if the first subset includes more than half of the fuses, or if the first subset contains a defective fuse, then the output state of each of the plurality of fuses is inverted (for example, by blowing the encoding fuse 150).

At step 306, each fuse in the second subset is blown.

At step 308, each fuse in the first subset is left intact.

If, on the other hand, at steps 302 and 310, half or fewer than half of the fuses 110–112 are included in the first set (to be blown), and there are no fuses identified as being defective in the first subset, then steps 312 and 314 are executed.

At step 312, the fuses in the first subset are blown.

At step 314, the fuses in the second subset are left intact.

For example, if fuses 110–112 are all to be blown, then at step 302, the first subset includes fuses 110–112, and the second subset of fuses (that are to remain intact) is the null set. Upon execution of step 302, it is determined that the number of fuses (three) in the first subset is greater than half the total number of fuses (three). Then at step 304, the outputs of each fuse 110–112 are inverted by blowing encoding fuse 150. At step 306, none of the fuses 110–112 need be blown, because the second subset is empty. At step 308, the fuses 110–112 in the first subset are all left intact. Thus, only one fuse (the encoding fuse 150) is blown, instead of blowing all three fuses 110–112. The inverted outputs of intact fuses 110–112 provide the same result to the functional circuitry 90 as though all three non-inverted fuses 110–112 were blown.

Although FIG. 3 shows the application of two different criteria (decision steps 302 and 310) to determine whether to blow the encoding fuse to invert the outputs of the fuse links 110–112, either of these criteria may be used alone. Further, if both steps 302 and 310 are included, the order of execution of steps 302 and 310 may be interchanged without affecting the performance of the method.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A semiconductor device comprising:

a plurality of fuses, each having an output state;

a plurality of latches, each latch coupled to an output of a respective one of the plurality of fuses; and an encoding fuse coupled to each of the plurality of latches, the encoding fuse having:

a first state in which each of the plurality of latches has an output that is the same as the state of the respective one of the plurality of fuses to which that latch is coupled, and a second state in which each of the plurality of latches has an output that is opposite the state of the respective one of the plurality of fuses to which that latch is coupled.

2. The semiconductor device of claim 1, further comprising means responsive to the encoding fuse for inverting an output of each of the plurality of fuses when the encoding fuse is in the second state.

3. The semiconductor device of claim 1, further comprising a plurality of XOR gates, each XOR gate having a first input coupled to the output of a respective one of the plurality of fuses and a second input coupled to the encoding fuse, each XOR gate having an output coupled to a respective one of the plurality of latches.

4. The semiconductor device of claim 3, wherein each of the plurality of latches is a D flip-flop.

5. The semiconductor device of claim 1, further comprising a plurality of XNOR gates, each XNOR gate having a first input coupled to the output of a respective one of the plurality of fuses and a second input coupled to the encoding fuse, each XNOR gate having an output coupled to a respective one of the plurality of latches.

6. The semiconductor device of claim 5, wherein each of the plurality of latches is a D flip-flop.

7. The semiconductor device of claim 1, wherein the plurality of fuses are buried metal fuses.

8. The semiconductor device of claim 1, wherein the semiconductor device is an integrated circuit.

9. The semiconductor device of claim 1, wherein the semiconductor device is a memory.

10. An integrated circuit including:

a plurality of buried metal fuses, wherein each buried metal fuse has an output state;

a plurality of latches, each latch corresponding to a respective one of the plurality of buried metal fuses;

an encoding fuse having a first state and a second state; and a plurality of gates, consisting of either a plurality of XOR gates or a plurality of XNOR gates, each gate having a first input coupled to the output of a respective one of the plurality of buried metal fuses and a second input coupled to the encoding fuse, each gate having an output coupled to a respective one of the plurality of latches, wherein:

each of the plurality of latches has an output state that is the same as the state of the respective one of the plurality of buried metal fuses to which that latch is coupled, when the encoding fuse is in the first state, and each of the plurality of latches has an output state that is opposite the state of the respective one of the plurality of buried metal fuses to which that latch is coupled, when the encoding fuse is in the second state.

11. The integrated circuit of claim 10, wherein the integrated circuit is a memory device.

* * * * *